(12) United States Patent
Bodin et al.

(10) Patent No.: US 6,504,366 B2
(45) Date of Patent: Jan. 7, 2003

(54) MAGNETOMETER PACKAGE

(75) Inventors: Joel J. Bodin, Chanhassen, MN (US); Michael J. Bohlinger, Minnetonka, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/681,396

(22) Filed: Mar. 29, 2001

(65) Prior Publication Data

US 2002/0140422 A1 Oct. 3, 2002

(51) Int. Cl.⁷ .................. G01R 33/02; H05K 5/06
(52) U.S. Cl. ............. 324/247; 174/254; 174/52.3
(58) Field of Search .................. 324/244, 247, 324/227, 228, 242, 243; 174/254, 260, 52.1, 52.3; 604/65; 33/300; 340/870.33; 361/417, 419

(56) References Cited

U.S. PATENT DOCUMENTS 5,121,289 A * 6/1992 Gagliardi ................ 361/380
5,414,355 A   5/1995 Davidson et al.
6,169,254 B1 * 1/2001 Pant et al. ............... 174/254

FOREIGN PATENT DOCUMENTS

DE   3822369 A1   6/1989

OTHER PUBLICATIONS

International Search Report

* cited by examiner

Primary Examiner—Edward Lefkowitz
Assistant Examiner—Reena Aurora
(74) Attorney, Agent, or Firm—Dennis C. Bremer

(57) ABSTRACT

A magnetometer package with a housing, a plurality of sensing elements, a board, and a sealing element. The housing has a first end, a second end, and a bore. The first end of the housing is adapted to receive the board and the sealing element. The second end of the housing is adapted to receive a plug. The plurality of sensing elements, the board, and the sealing element rest in the bore. The plurality of sensing elements are mounted on the board and are orientated so that their sensing axes sense magnetic fields in different directions.

32 Claims, 3 Drawing Sheets

MAGNETOMETER PACKAGE

BACKGROUND OF INVENTION

A three-axis magnetometer measures magnetic fields about three axes, i.e., x, y, and z axes. Typically, three individual directional sensors are orientated in each of the three axes. For example, a sensor is orientated to measure on the x-axis, another sensor is orientated to measure on the y-axis, and yet another sensor is orientated to measure on the z-axis. The sensors in the three-axis magnetometer are usually mounted with wire bonds, which are very delicate and require delicate packaging techniques. Because of the delicate packaging techniques associated with the wire bonds, the electronic packaging for a three-axis magnetometer requires a large enclosure. In such an enclosure, however, the directional sensors are substantially separated from one another which introduces significant errors in the accuracy of the measurements taken by the directional sensors. That is, the measurements are more accurate when the directional sensors are closer to each other.

The present invention integrates a plurality of sensing elements into a small magnetometer package. This packaging arrangement provides closer proximity between the plurality of sensing elements to accurately measure magnetic fields in all directions in three-dimensional space.

SUMMARY OF INVENTION

In accordance with one aspect of the present invention, a magnetometer package comprises a plurality of sensing elements, a housing, a board, and a sealing element. The plurality of sensing elements measure in a plurality of directions in three-dimensional space. The housing includes a first end and a second end. The board is coupled to the plurality of sensing elements. The sealing element, which is in the first end, seals the first end and engages the plurality of sensing elements so as to fasten the plurality of sensing elements within the housing.

In accordance with another aspect of the present invention, a magnetometer package comprises a plurality of sensing elements, a housing, a board, a first sealing element, and a second sealing element. The plurality of sensing elements measure magnetic fields in a plurality of directions in three-dimensional space. The plurality of sensing elements are orientated so as to measure magnetic fields in different directions. The housing includes a first end and a second end. The board supports the plurality of sensing elements. The first sealing element seals the first end and the second sealing element seals the second end. The first and second sealing elements engage the plurality of sensing elements so as to fasten the plurality of sensing elements within the housing.

In accordance with yet another aspect of the present invention, a method of making a three-axis magnetometer comprises coupling three sensing elements to a common board so that their sensing axes are mutually perpendicular; and sealing the three sensing elements and common board within a housing.

BRIEF DESCRIPTION OF DRAWINGS

These and other features and advantages of the present invention will become more apparent upon a reading of the following description in conjunction with the drawings in which.

DETAILED DESCRIPTION

Figure 1:
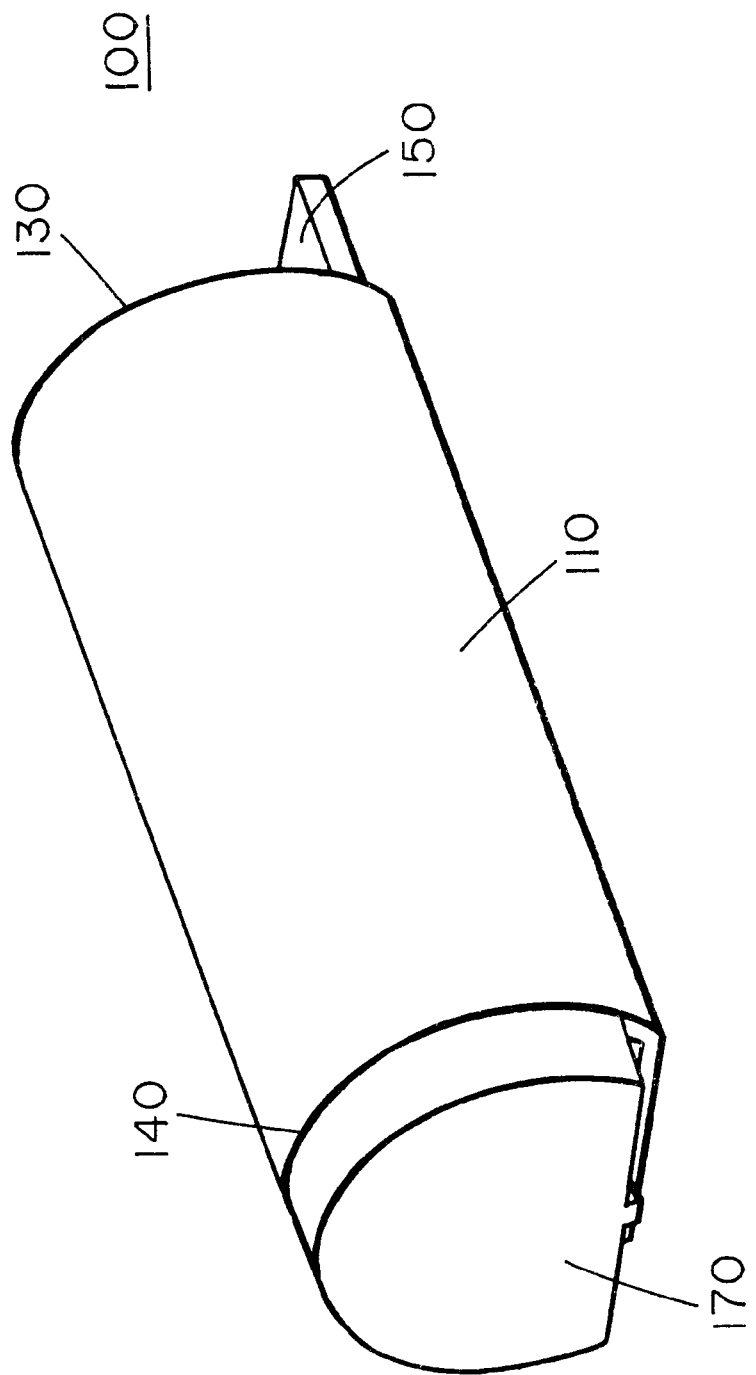
FIG. 1 is an isometric drawing of a magnetometer package in accordance with the present invention.
Figure 2:
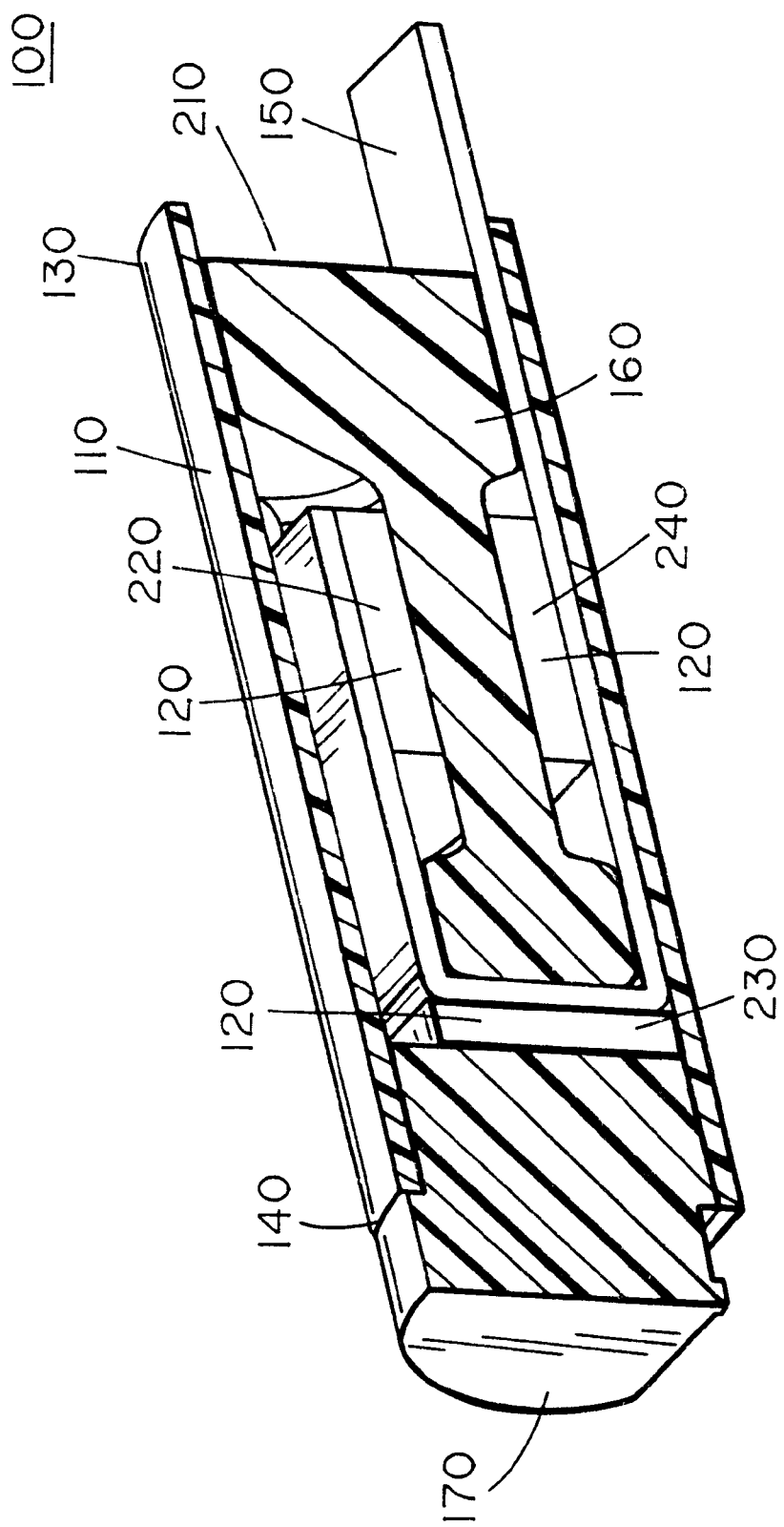
FIG. 2 illustrates a cross-sectional side view of the magnetometer package in accordance with the present invention.

As shown in FIGS. 1 and 2, a magnetometer package 100 generally includes a housing 110 and a plurality of sensing elements 120. The housing 110, such as a tube, includes a first end 130 and a second end 140. The housing 110 may be, but is not limited to, a non-conducting material such as plastic or ceramic. The first end 130 is adapted to receive a board 150 and a first sealing element 160. The board 150 is coupled to, engages, and/or supports the plurality of sensing elements 120, which are further described in detail below. Furthermore, the board 150 may be, but is not limited to, a flexible circuit board such as flex tape. The second end 140 is adapted to receive a second sealing element 170 such as a plug. The first and second sealing elements 160, 170 may be, but are not limited to, non-conducting materials such as plastic or ceramic. In an alternate embodiment, the housing 110 is closed at the second end 140 so that the sealing element 170 in the second end 140 is not required.

The housing 110 has a bore 210, into which the plurality of sensing elements 120, the board 150, the first sealing element 160, and the second sealing element 170 are inserted. The plurality of sensing elements 120, which are fastened within the bore 210, are orientated to take measurements in three dimensional space, i.e., each sensing element takes measurements about a particular axis. In particular, the plurality of sensing elements 120 include a first sensing element 220, a second sensing element 230, and a third sensing element 240. The first sensing element 220 is sandwiched between the board 150 and the first sealing element 160. The third sensing element 240 is also sandwiched between the board 150 and the first sealing element 160. The second sensing element 230 is sandwiched between the second sealing element 170 and the first sealing element 160 through the board 150.

Moreover, the plurality of sensing elements 120 are mounted to the board 150, which forms a j-like shape within the bore 210 of the housing 110. In particular, the sensing axes of the first sensing element 220 and the second element 230 are perpendicular, i.e., form a 90 degrees angle, respective to one another. The sensing axis of the second sensing element 230 is perpendicular with respect to the sensing axes of the first sensing element 220 and the third sensing element 240. Physically, the planes of the first sensing element 220 and the third sensing element 240 are parallel respective to one another and are perpendicular to the plane of the second sensing element 230.

The first sealing element 160 and the second sealing element 170 engage the plurality of sensing elements 120 so as to fasten the plurality of sensing elements 120 within the bore 210 of the housing 110. In particular, the first sealing element 160 is sandwiched between the first sensing element 220 and the third sensing element 240, the first sensing element 220 is sandwiched between the first sealing element 160 and the board 150, and the third sensing element 240 is sandwiched between the first sealing element 160 and the board 150. Also, the first sealing element 160 engages the second sensing element 230 through the board 150 so that the second sensing element 230 is sandwiched between the second sealing element 170 and the board 150. As mentioned above, the second sealing element 170 may be unnecessary in an alternate embodiment. For example, the housing 110 may have a closed end, i.e., at the second end 140, and an open end, i.e., at the first end 130, so that the second sealing element 170 is not necessary to fasten the plurality of sealing elements 120.

Nonetheless, both the first sealing element 160 and second sealing element 170 engage the plurality of sensing elements 120 so that each of the sensing elements 120 is immobilized within the bore 210 of the housing 110. As a result, the plurality of sensing elements 120 are able to measure accurately in three axes. For example, the first sensing element 220 measures about the y-axis, the second sensing element 230 measures about the z-axis, and the third sensing element 240 measures about the x-axis.

Figure 3:
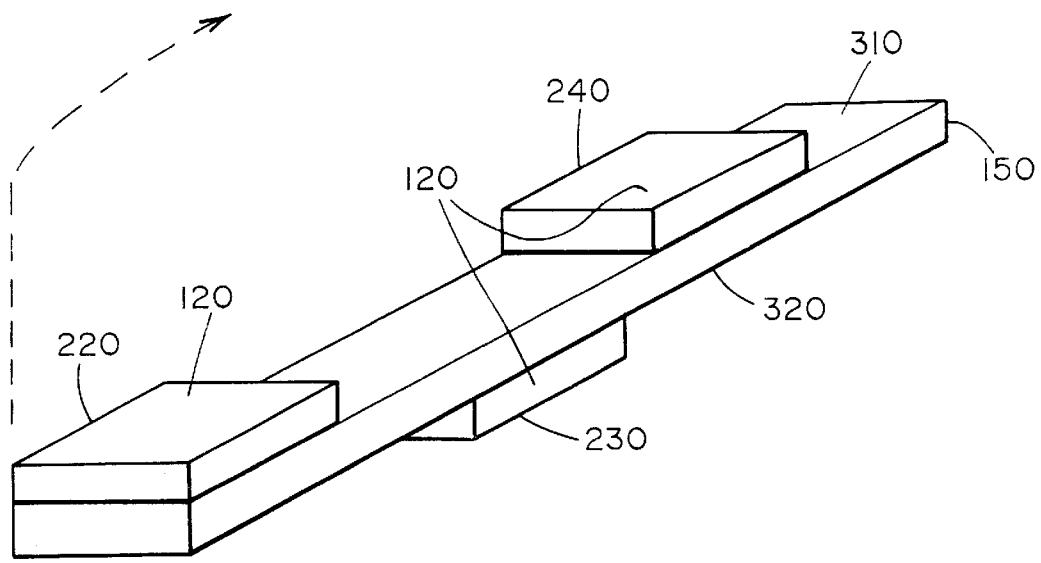
FIG. 3 is an isometric drawing of a board coupled to a plurality of sensing elements in accordance with the present invention.

As shown in FIG. 3, the plurality of sensing elements 120 are mounted on the board 150. The board 150 generally includes a first surface 310 and a second surface 320. The plurality of sensing elements 120 may be mounted to either the first surface 310 or the second surface 320. In particular, the first sensing element 220 and the third sensing element 240 are mounted to the first surface 310, and the second sensing element 230 is mounted to the second surface 320. As mentioned above, the board 150 is constructed to form a j-like shape within the bore 210 of the housing 110 so that the plurality of sensing elements 120 are orientated to measure about their respective directions. In an alternate embodiment, the plurality of sensing elements 120 may be mounted on the same surface of the board 150. For example, the first, second, and third sensing elements, 220, 230, 240, respectively, may be mounted on the first surface 310 of the board 150.

Figure 4:
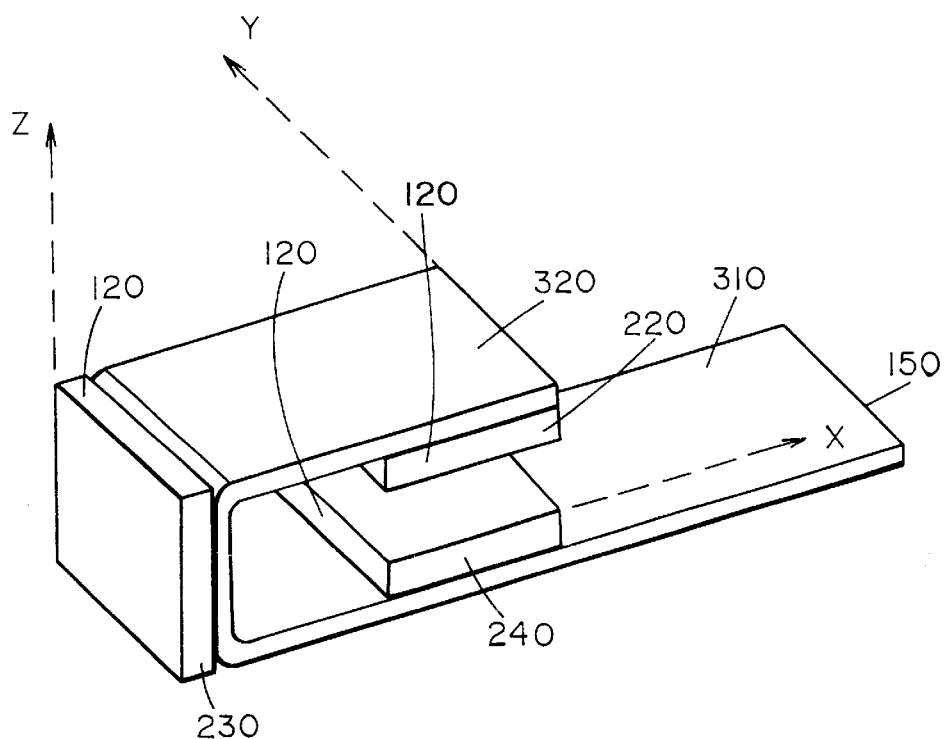
FIG. 4 is an isometric drawing of the board in FIG. 3 constructed in a j-like shape in accordance with the present invention.

As noted above the board 150 may be a flexible circuit board such as flex tape. As shown in FIG. 4, the board 150 is folded to form a j-like shape prior to packaging the plurality of sensing elements 120 within the bore 210 of the housing 110. As also noted above, the plurality of sensing elements 120 are orientated to measure magnetic fields about each of three axes. For example, the first sensing element 220 is orientated to measure magnetic fields about the y-axis, the second sensing element 230 is orientated to measure magnetic fields about the z-axis, and the third sensing element 240 is orientated to measure magnetic fields about the x-axis. In other embodiments, the plurality of sensing elements 120 may be able to take measurements in three-dimensional space other than magnetic fields.

Certain modifications of the present invention have been discussed above. Other modifications will occur to those practicing in the art of the present invention. As illustrated in FIG. 1, for example, the magnetometer package 100 includes a second sealing element 170 such as a plug. As noted above, however, the housing 110 may have a closed end, i.e., at the second end 140, and an open end, i.e., at the first end 130. Accordingly, the second sealing element 170 may be unnecessary to seal the housing 110 at the second end 140.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A magnetometer package comprising:
   a plurality of sensing elements for measuring in a plurality of directions in three-dimensional space;
   a housing having a first end and a second end;
   a board coupled to the plurality of sensing elements; and
   a formed plug in the first end, wherein the formed plug seals the first end and engages the plurality of sensing elements so as to fasten the plurality of sensing elements within the housing.

2. The magnetometer package of claim 1, wherein the plurality of sensing elements include a first sensing element, a second sensing element, and a third sensing element.

3. The magnetometer package of claim 2, wherein the first, second, and third sensing elements are orientated so that the first, second, and third sensing elements have sensing axes that are perpendicular to each other.

4. The magnetometer package of claim 2, wherein the first sensing element and the third sensing element are supported in corresponding planes that are parallel to each other.

5. The magnetometer package of claim 4, wherein the formed plug is sandwiched between the first sensing element and the third sensing element.

6. The magnetometer package of claim 5, wherein the first, second, and third sensing elements are orientated so that the first, second, and third sensing elements have sensing axes that are perpendicular to each other.

7. The magnetometer package of claim 4, wherein the second sensing element is supported in a plane that is perpendicular to the planes of the first and third sensing elements.

8. The magnetometer package of claim 2, wherein the first and third sensing elements are supported on a first surface of the board, and wherein the second sensing element is supported on a second opposing surface of the board.

9. The magnetometer package of claim 8, wherein the formed plug engages the first and third sensing elements directly and engages the second sensing element through the board.

10. The magnetometer package of claim 1, further comprising a sealing element in the second end.

11. The magnetometer package of claim 10, wherein the sealing element includes a plug.

12. The magnetometer package of claim 1, wherein the board includes a flexible board.

13. The magnetometer package of claim 12, wherein the flexible board includes a flex tape.

14. The magnetometer package of claim 12, wherein the flexible board is constructed to form a j-like shape.

15. A magnetometer package comprising:
   a plurality of sensing elements for measuring magnetic fields in a plurality of directions in three-dimensional space;
   a housing having a first end and a second end;
   a board supporting the plurality of sensing elements;
   a first formed plug sealing the first end;
   a second formed plug sealing the second end, wherein the first and second formed plugs engage the plurality of sensing elements so as to fasten the plurality of sensing elements within the housing, and wherein the plurality of sensing elements are orientated so as to measure magnetic fields in different directions.

16. The magnetometer package of claim 15, wherein the plurality of sensing elements include a first sensing element, a second sensing element, and a third sensing element.

17. The magnetometer package of claim 16, wherein the first, second, and third sensing elements are orientated so that the sensing elements have sensing axes that are perpendicular to each other.

18. The magnetometer package of claim 16, wherein the first sensing element and the third sensing element are supported in corresponding planes that are parallel to each other.

19. The magnetometer package of claim 18, wherein the second sensing element is supported in a plane that is perpendicular to the planes of the first and third sensing elements.

20. The magnetometer package of claim 16, wherein the first and third sensing elements are supported on a first surface of the board, and wherein the second sensing element is supported on a second opposing surface of the board.

21. The magnetometer package of claim 20, wherein the first formed plug directly engages the first and third sensing elements and indirectly engages the second sensing element through the board, and wherein the second formed plug directly engages the second sensing element.

22. The magnetometer package of claim 21, wherein the first and third sensing elements engage a first surface of the board, and wherein the second sensing element engages a second opposing surface of the board.

23. The magnetometer package of claim 15, wherein the board includes a flexible circuit board.

24. The magnetometer package of claim 23, wherein the flexible board includes a flex tape.

25. The magnetometer package of claim 23, wherein the flexible board is constructed to form a j-like shape.

26. A method of making a three-axis magnetometer comprising:
   a) coupling first, second, and third sensing elements to a common board;
   b) folding the common board around a plug so that the sensing axes of the first, second, and third sensing elements are mutually perpendicular and so that the plug engages at least two of the first, second, and third sensing elements; and
   c) inserting the plug into a housing so that the plug seals the first, second, and third sensing elements and the common board within the housing.

27. The method of claim 26, wherein the folding of the common board around a plug includes orientating the first sensing element and the second sensing element in planes that are parallel to each other.

28. The method of claim 27, wherein the folding of the common board around a plug includes orientating the third sensing element in a plane that is perpendicular to the planes of the first and second sensing elements.

29. The method of claim 28, wherein the folding of the common board around a plug includes sandwiching one of the first, second, and third sensing elements between the board and the plug.

30. The method of claim 28, wherein the folding of the common board around a plug includes sandwiching the first and second sensing elements between a surface of the common board and the plug.

31. The method of claim 30, wherein the plug is a first plug, and wherein the method further includes sealing the first, second, and third sensing elements with a second plug so that the third sensing element engages the second plug.

32. The method of claim 26, wherein the folding of the common board around a plug includes sandwiching one of the first, second, and third sensing elements between the board and the plug.

* * * * *